United States Patent
Giusti

(10) Patent No.: US 10,513,428 B2
(45) Date of Patent: Dec. 24, 2019

(54) MEMS DEVICE INCLUDING A PIEZOELECTRIC ACTUATOR WITH A REDUCED VOLUME

(71) Applicant: STMICROELECTRONICS S.R.L., Agrate Brianza (IT)

(72) Inventor: Domenico Giusti, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/867,491

(22) Filed: Jan. 10, 2018

(65) Prior Publication Data

US 2018/0215607 A1 Aug. 2, 2018

(30) Foreign Application Priority Data

Jan. 31, 2017 (IT) .................. 102017000010342

(51) Int. Cl.
- *B41J 2/14* (2006.01)
- *H01L 41/08* (2006.01)
- *B81B 3/00* (2006.01)
- *H01L 41/09* (2006.01)

(52) U.S. Cl.
CPC ......... *B81B 3/0021* (2013.01); *B41J 2/14233* (2013.01); *H01L 41/0805* (2013.01); *H01L 41/0973* (2013.01); *B41J 2002/1437* (2013.01); *B41J 2002/14241* (2013.01); *B81B 2201/058* (2013.01)

(58) Field of Classification Search
CPC ............ B81B 3/0021; B81B 2201/058; H01L 41/0805; H01L 41/0973

USPC ............................................ 257/416; 438/50
See application file for complete search history.

(56) References Cited

U.S. PATENT DOCUMENTS

| | | | |
|---|---|---|---|
| 2003/0001931 A1 | 1/2003 | Isono | |
| 2011/0115337 A1* | 5/2011 | Nakamura | G10K 9/122 310/334 |
| 2012/0087522 A1* | 4/2012 | Lee | H04R 17/005 381/190 |
| 2014/0313264 A1* | 10/2014 | Cattaneo | B41J 2/14233 347/68 |
| 2017/0173955 A1* | 6/2017 | Mizukami | B41J 2/14201 |
| 2018/0141074 A1 | 5/2018 | Giusti et al. | |

FOREIGN PATENT DOCUMENTS

| | | |
|---|---|---|
| CN | 103490743 A | 1/2014 |
| CN | 104575485 A | 4/2015 |

OTHER PUBLICATIONS

D. M. Kim et al., "Thickness dependence of structural and piezoelectric properties of epitaxial $Pb(Zr_{0.52}Ti_{0.48})O_3$ films on Si and $SrTiO_3$ substrates", Applied Physics Letters 88, 142904 (2006), 3 pages.

* cited by examiner

*Primary Examiner* — Didarul A Mazumder
(74) *Attorney, Agent, or Firm* — Seed Intellectual Property Law Group LLP

(57) ABSTRACT

What is described is a MEMS device comprising a piezoelectric actuator, which includes a film of piezoelectric material. The film is penetrated by a plurality of holes.

19 Claims, 5 Drawing Sheets

MEMS DEVICE INCLUDING A PIEZOELECTRIC ACTUATOR WITH A REDUCED VOLUME

BACKGROUND

Technical Field

The present disclosure relates to a MEMS device including a piezoelectric actuator having a reduced volume.

Description of the Related Art

As is known, numerous MEMS devices are available at the present time, each incorporating one or more piezoelectric actuators.

For example, Italian patent application no. 102016000118584, filed on 23 Nov. 2016 on behalf of the present applicant, which corresponds to U.S. Patent Application Publication No. 2018/0141074, describes a microfluidic device 30, as shown in FIG. 1.

The microfluidic device 30 of FIG. 1 comprises a lower portion, an intermediate portion and an upper portion.

The lower portion is formed by a first region 32 of semiconductor material (silicon, for example), which forms an inlet channel 40.

The intermediate portion is superimposed on the lower portion and is formed by a second region 33 of semiconductor material (silicon, for example), which laterally delimits a fluid containment chamber 31. The fluid containment chamber 31 is also delimited below by the first region 32 and above by a membrane layer 34, formed by silicon oxide for example. The area of the membrane layer 34 arranged above the fluid containment chamber 31 forms a membrane 37. The membrane layer 34 is made with a thickness such that it can be deflected, equal to about 2.5 µm for example.

The upper portion is superimposed on the intermediate portion, and is formed by a third region 38 of semiconductor material (silicon, for example), which delimits an actuator chamber 35 superimposed on the fluid containment chamber 31. The third region 38 forms a through channel 41, in communication with the fluid containment chamber 31 through a corresponding opening 42 in the membrane layer 34.

A piezoelectric actuator 39 is placed above the membrane 37 in the actuator chamber 35. The piezoelectric actuator 39 is formed by a pair of electrodes, 43, 44 between which there extends a piezoelectric region 29 formed, for example, from PZT (Pb, Zr, TiO$_3$). The piezoelectric region 29 surmounts, and is in direct contact with, a first of said electrodes, indicated by 43, and is surmounted by, and in direct contact with, the other electrode, which is referred to below as the second electrode 44.

A nozzle plate 36 is placed above the third region 38, being bonded thereto by a bonding layer 47. The nozzle plate 36 has a hole 48, arranged above and in fluid connection with the channel 41 via an opening 46 in the bonding layer 47. The hole 48 forms a nozzle of a drop emission channel, indicated as a whole by 49 and also comprising the through channel 41 and the openings 42, 46.

In use, the fluid containment chamber 31 is filled through the inlet channel 40 with a fluid or liquid to be ejected. In a first stage, the piezoelectric actuator 39 is then operated so as to cause a deflection of the membrane 37 towards the inside of the fluid containment chamber 31. This deflection causes a movement of the fluid present in the fluid containment chamber 31 towards the drop emission channel 49 and causes the controlled expulsion of a drop, as represented by the arrow 45. In a second stage, the piezoelectric actuator 39 is operated in the opposite direction, so as to increase the volume of the fluid containment chamber 31, thus drawing more fluid through the inlet channel 40.

Regardless of the details of application shown in FIG. 1, at the present time the piezoelectric layers forming piezoelectric actuators of the known type are, in most cases, formed of the aforementioned PZT, which has satisfactory piezoelectric behavior, but contains a high percentage of lead. Unfortunately, lead is highly toxic, and there is consequently a need to find alternative solutions to the use of PZT.

As is known, various lead-free piezoelectric compounds, such as ceramics of the $BaTiO_3$ type, have been identified over the years. Usually, however, the alternative compounds available today are characterized by a performance which is not particularly good as regards to the piezoelectric behavior.

A different approach is that of reducing the amount of lead present in the piezoelectric actuator without eliminating it completely, so that the good piezoelectric performance of its constituent compounds can be retained. In particular, this approach requires a reduction in the thickness of the layers of piezoelectric material. Unfortunately, if the thickness of a PZT layer is reduced excessively (to less than 1 µm), this leads to a substantial reduction in the piezoelectric properties of the PZT, particularly what is known as the d33 coefficient.

BRIEF SUMMARY

One or more embodiments are directed to a MEMS device comprising a piezoelectric actuator with a reduced volume.

BRIEF DESCRIPTION OF THE SEVERAL VIEWS OF THE DRAWINGS

To enable the present disclosure to be understood more fully, preferred embodiments thereof will now be described, purely by way of non-limiting example, with reference to the attached drawings, in which.

Figure 4:
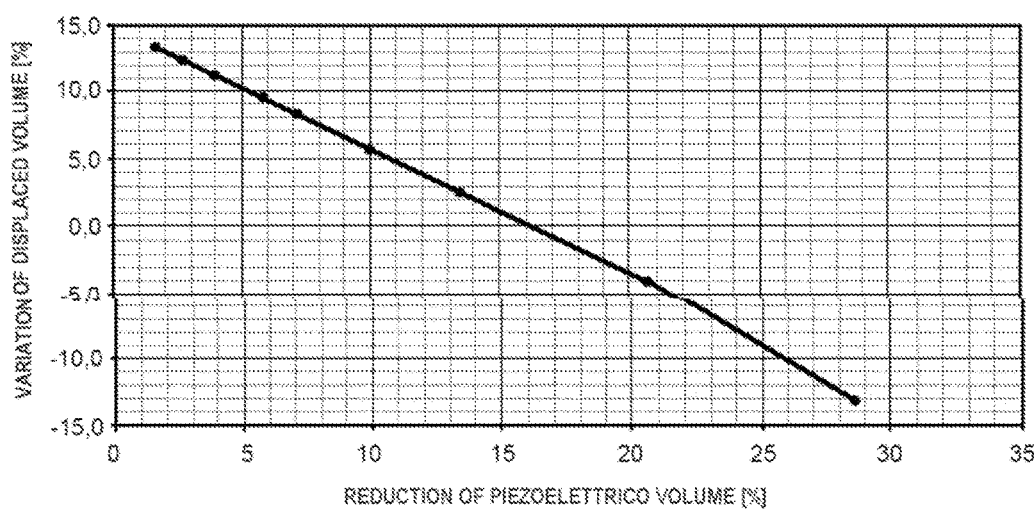
Figure 5A:
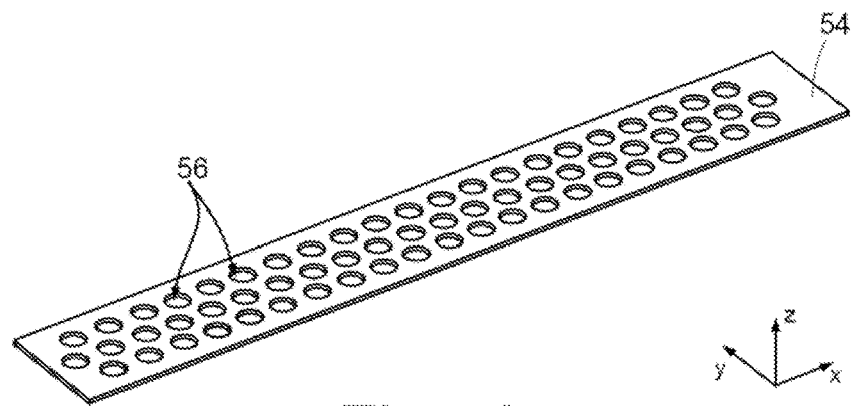
Figure 5B:
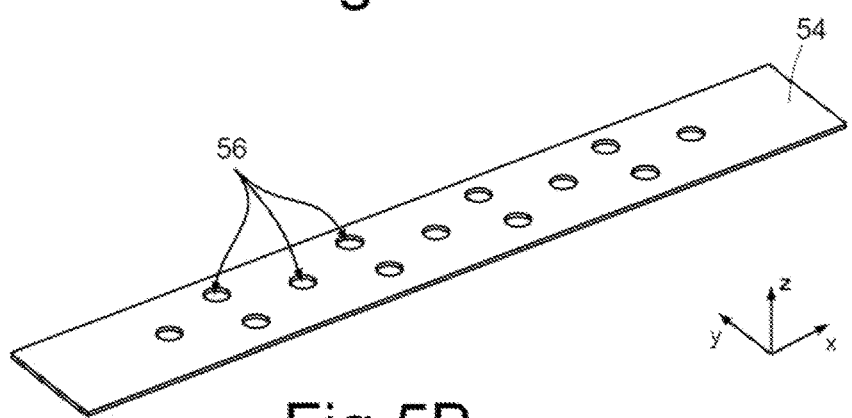
Figure 6:
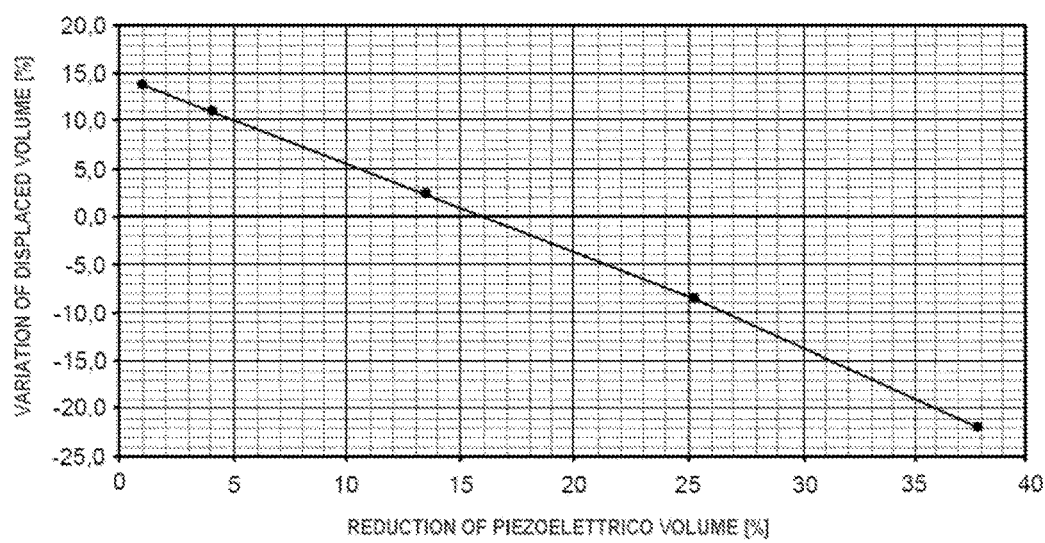
Figure 7A:
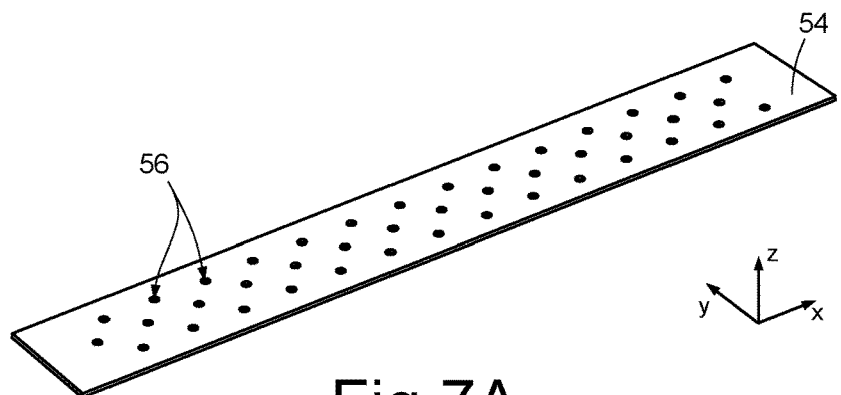
Figure 7B:
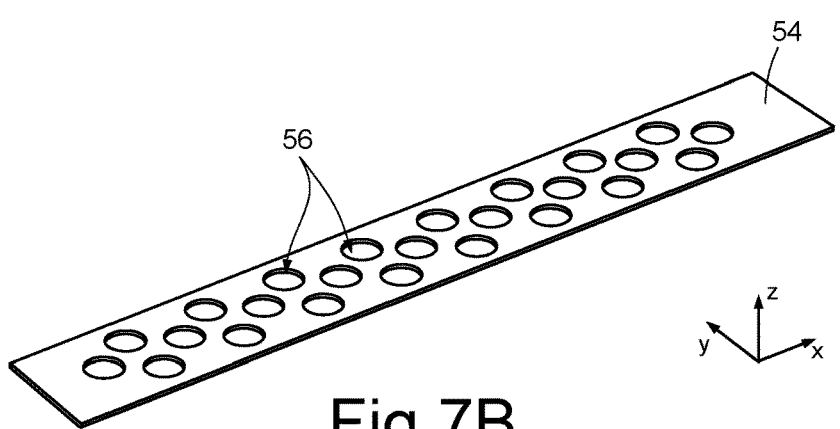
Figure 8:
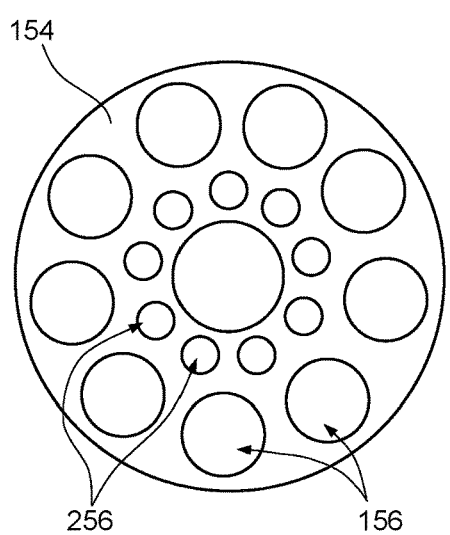
Figure 9:
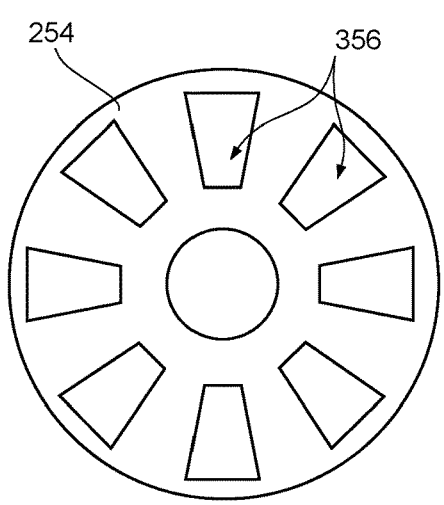

Each of FIGS. 4 and 6 shows the trend of the variation of volume displaced by a piezoelectric actuator, as a function of a reduction of volume of a piezoelectric region forming the actuator, relative to a reference region;

FIGS. 5A and 5B show schematically perspective views of examples of piezoelectric regions corresponding to two different points on the curve shown in FIG. 4;

FIGS. 7A and 7B show schematically perspective views of examples of piezoelectric regions corresponding to two different points on the curve shown in FIG. 6; and FIGS. 8 and 9 show schematically views from above of piezoelectric regions of two different embodiments of the present MEMS device.

DETAILED DESCRIPTION

Figure 2:
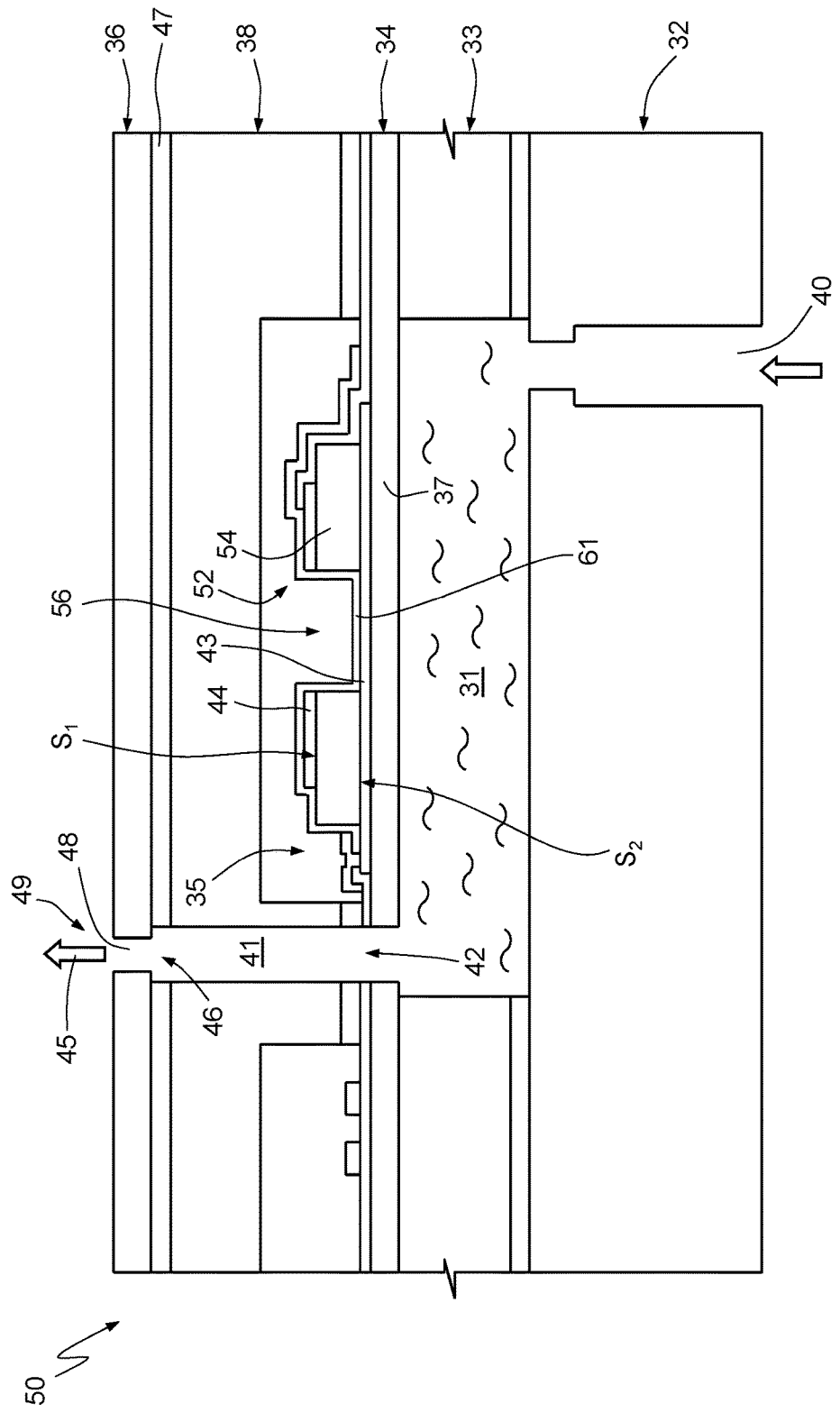
FIG. 2 shows schematically a cross section through an embodiment of the present MEMS device.

Without any loss of generality, the following text describes a piezoelectric actuator 52, with reference to the case in which the actuator itself forms a microfluidic device 50, shown in FIG. 2. Additionally, the microfluidic device 50 is described below with reference to the differences from the microfluidic device 30; components of the microfluidic device 50 already present in the microfluidic device 30 are indicated by the same reference symbols, unless specified otherwise.

Figure 3:
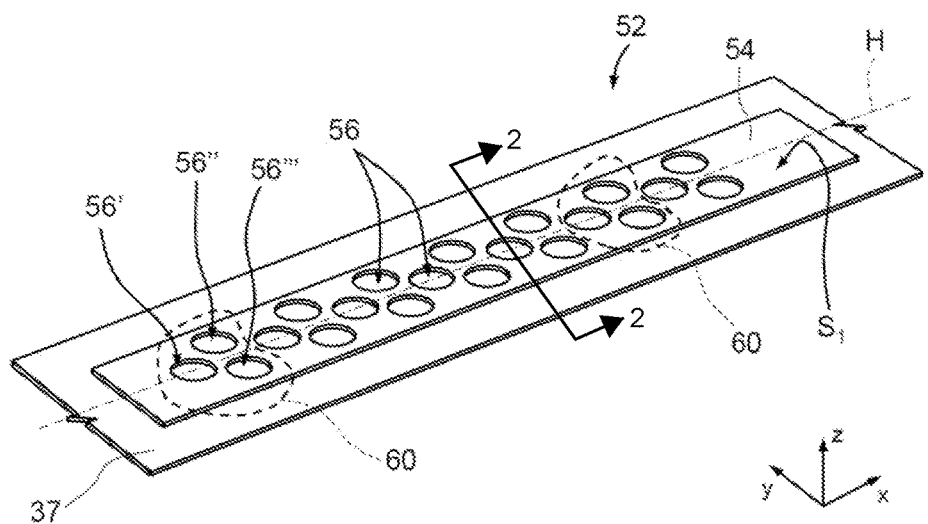
FIG. 3 shows schematically a perspective view of a portion of the present MEMS device.

Given the above, as shown in greater detail in FIG. 3, the piezoelectric actuator 52 comprises the piezoelectric region or film, indicated here by 54 and formed by a film of PZT, which has been deposited on the first electrode 43 (FIG. 2). For greater clarity, FIG. 3 does not show any electrodes, and also omits other details; the piezoelectric region 54 is therefore shown as being placed in direct contact with the underlying membrane 37.

In detail, the piezoelectric region 54 is delimited above and below by a first and a second surface $S_1$, $S_2$ respectively (the second surface $S_2$ is shown in FIG. 2). The thickness of the piezoelectric region 54 is, for example, greater than or equal to 0.2 µm; for example, the thickness of the piezoelectric region 54 is within the range of 0.2 µm-28 µm. Without any loss of generality, the piezoelectric region 54 forms a single-layer piezoelectric structure, that is to say a structure free of bonding.

A plurality of through holes 56 extend in the piezoelectric region 54. Each hole 56 therefore extends between the first and the second surface $S_1$, $S_2$.

In the embodiment shown in FIGS. 2 and 3, the holes 56 are identical to each other, and each of them is of cylindrical shape. The holes 56 are also arranged in a repeated pattern within the piezoelectric region 54.

In detail, FIG. 3 also shows a Cartesian reference system xyz, such that the first and the second surface $S_1$, $S_2$ are parallel to the plane xy. Additionally, when viewed from above, the piezoelectric region 54 has a rectangular shape, elongated parallel to the axis x. In this connection, FIG. 3 also shows an axis of symmetry H of the piezoelectric region 54, parallel to the axis x.

In greater detail, in the embodiment shown in FIGS. 2 and 3, the holes 56 are arranged so as to form a plurality of cells 60 identical to each other, which are repeated periodically in space, with the same orientation.

In particular, each cell 60 comprises a first hole, a second hole, and a third hole, indicated respectively by 56', 56" and 56'''. When viewed from above, the first hole 56' has a center lying on the axis of symmetry H; the first hole 56' is also arranged symmetrically with respect to the axis of symmetry H.

The second and third holes 56" and 56'" are arranged at a distance from the axis of symmetry H; additionally, the second and third holes 56" and 56'" are symmetrical to each other with respect to the axis of symmetry H. In practice, when viewed from above, the centers of the second and third holes 56" and 56'" are arranged along an axis parallel to the axis y. Additionally, when viewed from above, the centers of the first, second and third holes 56', 56" and 56'" are arranged at the vertices of an equilateral triangle.

The cells 60 are arranged along the axis of symmetry H, are spaced at equal intervals from each other, and, as mentioned above, have the same orientation. Furthermore, in the case of the first holes 56' of two adjacent cells 60, when viewed from above the respective centers are equidistant from the axis which unites the second and third holes 56" and 56'" interposed between the first holes. Consequently, when viewed from above, the centers of the holes 56 are arranged at the nodes of a mesh with rhomboidal cells.

The piezoelectric actuator 52 further comprises a dielectric region 61, which is shown in a purely qualitative way in FIG. 2.

The dielectric region 61 is formed, for example, by a layer of silicon oxide (or silicon nitride, or alumina) which has a thickness of between 100 nm and 2 µm, for example, and surmounts, and is in direct contact with, the second electrode 44. Additionally, the dielectric region 61 extends within the holes 56, so as to entirely cover the lateral wall of each hole 56, as well as the portion of the first electrode 43 which faces the bottom of the hole 56; thus the second electrode 44 is also pierced. In other words, in the embodiment shown in FIG. 2, each hole 56 extends not only through the piezoelectric region 54, but also through the second electrode 44, and is closed below by the first electrode 43.

Without any loss of generality, in the case of each hole 56, the portion of the hole 56 not occupied by the dielectric region 61 is occupied by air, or (in a case which is not shown) by a material (a polymer for example) having a mechanical rigidity which is negligible relative to the rest of the piezoelectric actuator 52.

Figure 1:
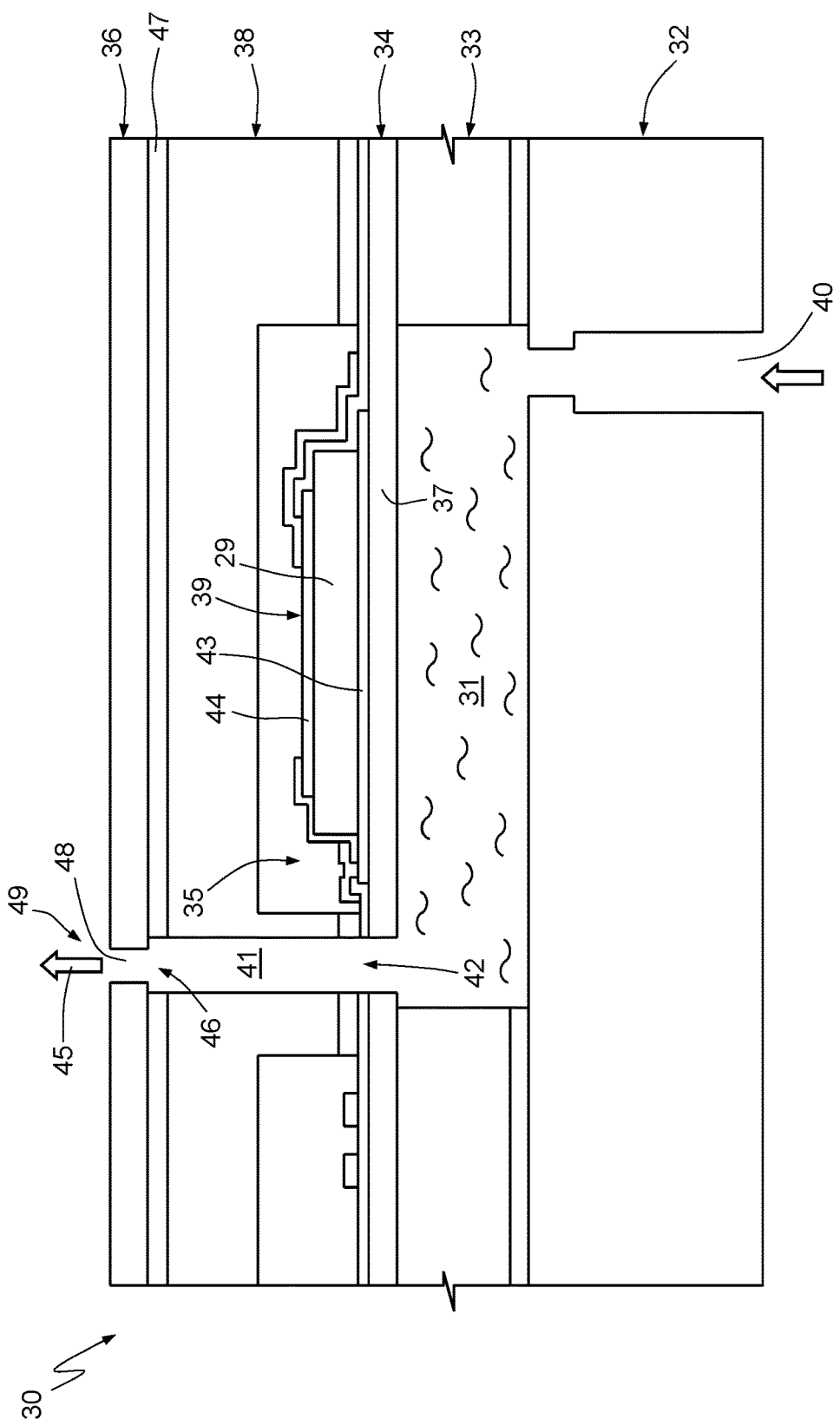
FIG. 1 shows schematically a cross section through a microfluidic device of a known type.

For practical purposes, the piezoelectric region 54 may have the same thickness as the piezoelectric region 29 of the piezoelectric actuator 39 shown in FIG. 1, but it has a smaller volume, and consequently a lower lead content. The applicant has also observed that the reduction of volume does not, in a first approximation, lead to a reduction of the piezoelectric performance of the piezoelectric region 54, as explained in greater detail below.

In quantitative terms, FIG. 4 shows the trend of the change of volume displaced (as a percentage) relative to the reduction of the volume of the piezoelectric region (as a percentage). In particular, the reduction of the volume of the piezoelectric region indicates the relationship between the volume occupied by the holes 56 and the volume of a reference region (not shown) which is equal to the piezoelectric region 54, but has no holes 56. Additionally, if Vo and Va indicate, respectively, the volume of the fluid containment chamber 31 when the piezoelectric actuator is not actuated and the volume of the fluid containment chamber 31 when the piezoelectric actuator is actuated by the application of a given voltage, and if Vdelta indicates what is known as the displaced volume (i.e., Vdelta=Vo-Va), the variation of displaced volume is equal to 100*(Vdelta_PZT_forato-Vdelta_PZT_intero)/(Vdelta_PZT_intero), where Vdelta_PZT_intero is the volume displaced by the piezoelectric actuator 39, while Vdelta_PZT_forato is the volume displaced in the case of the piezoelectric actuator 52.

Also with reference to FIG. 4, this diagram was drawn on the assumption that the holes 56 have, as mentioned above, the same diameter, and that the volume reduction is obtained by increasing the interval (or "pitch") between the holes 56, and therefore gradually reducing the number of holes 56. In this connection, purely by way of example, the shapes of the piezoelectric region 54 shown in FIGS. 5a and 5b refer, respectively, to the upper end and to an intermediate point of the curve shown in FIG. 4.

In a first approximation, the curve shown in FIG. 4 passes through zero when the value of the reduction of the volume of the piezoelectric region is equal to about 16%; this means that, for this value, the piezoelectric behavior of the piezoelectric region 54 is substantially equal to the piezoelectric behavior of the piezoelectric region 29, even though the piezoelectric region 54 contains a smaller amount of piezoelectric material (PZT). It should also be noted that, for values of reduction of the volume of the piezoelectric region of less than 16%, there is an unexpected increase in the piezoelectric performance of the piezoelectric region 54 relative to the piezoelectric region 29; this is explained by the fact that the reduction of piezoelectric material leads to a reduction of the rigidity of the piezoelectric region 54. Furthermore, for values of reduction of the volume of the piezoelectric region of more than 16%, there is a reduction of the piezoelectric performance of the piezoelectric region 54 relative to the piezoelectric region 29; this reduction takes place with an angular coefficient of about 1.088.

As a general rule, if the reduction of the volume of the piezoelectric region is within the range of 1% to 20%, the piezoelectric performance remains satisfactory. As a general rule, if the reduction of the volume of the piezoelectric region is within the range of 10% to 20%, and especially if it is within the range of 15% to 17%, a good compromise is achieved between the piezoelectric performance and the reduction of the amount of lead.

From another point of view, FIG. 6 again shows the trend of the variation of volume displaced relative to the reduction of the volume of the piezoelectric region. However, the curve shown in FIG. 6 was obtained by keeping a fixed arrangement of the centers of the holes 56 (which are still identical to each other) and varying their diameter. In this connection, purely by way of example, FIGS. 7a and 7b show shapes of the piezoelectric region 54 which refer, respectively, to the upper end and to an intermediate point of the curve shown in FIG. 6.

The trend of the curve shown in FIG. 6 is, in a first approximation, identical to the trend of the curve shown in FIG. 4. Consequently, in a first approximation, the behavior of the piezoelectric region 54 as a function of the amount of volume occupied by the holes 56 does not differ according to whether this amount is obtained by increasing or decreasing the density of the holes 56 or by varying the sizes of the holes 56.

As shown in FIG. 8, there are also possible embodiments different from that shown and described above. In particular, in the embodiment shown in FIG. 8, the piezoelectric region, indicated here by 154, takes the form of a hollow cylinder, in which are arranged holes of a first and second type, indicated by 156 and 256 respectively, which will be referred to below as the main holes 156 and the secondary holes 256 respectively.

In greater detail, the main holes 156 and the secondary holes 256 are again of the through type and have a cylindrical shape. The main holes 156 are identical to each other; the secondary holes 256 are also identical to each other, and have a smaller diameter than that of the main holes 156.

When viewed from above, the centers of the main holes 156 are arranged along a first circumference; the main holes 156 are also spaced at equal angular intervals. The centers of the secondary holes 256 are arranged along a second circumference, inside the first circumference, and are also spaced at equal angular intervals. The angular distribution of the secondary holes 256 is also angularly offset (by 25°, for example) relative to the angular distribution of the main holes 156.

In practice, the main holes 156 and the secondary holes 256 define a distribution with central symmetry. Thus, because of the angular offset, the reduction in volume is obtained without the need to place the holes too closely together.

FIG. 9 shows a different embodiment in which the piezoelectric region, indicated here by 254, again takes the form of a hollow cylinder. Additionally, a plurality of holes 356 are formed in the hollow cylinder, these holes being of the through type, identical to each other, equidistant from the axis of the hollow cylinder, and spaced at equal angular intervals. Furthermore, each of the holes 356 has the shape of a prism based on an isosceles trapezium. In practice, the holes 356 again define a distribution with central symmetry.

The advantages provided by the present piezoelectric actuator are clearly apparent from the above description. In particular, the present piezoelectric actuator is characterized by good piezoelectric performance, since the thickness is not necessarily reduced, although it has a reduced amount of piezoelectric material; the latter characteristic is particularly advantageous in a case where the piezoelectric material contains potentially toxic elements.

Finally, the piezoelectric actuator described and illustrated herein can clearly be modified and varied without departure from the protective scope of the present disclosure.

For example, instead of PZT it would be possible to use any other piezoelectric material, such as aluminum nitride.

Regarding the shape of the piezoelectric region, this may differ from what has been described. As a general rule, the piezoelectric region always forms a structure having a single piezoelectric layer, that is to say a layer that does not contact any other piezoelectric regions, and is not subject to sintering.

The shape and arrangement of the holes may also be different from what has been described. For example, it is possible for one or more holes to contain conductive material (not shown), surrounded by the dielectric region, so as to prevent the creation of electrical contact between the piezoelectric region and the conductive material. In other words, the lateral walls of the holes do not contact any conductive region. Additionally, using the expression "filling structure" generically to indicate the content (the dielectric region and the conductive material surrounded by it) present inside each hole, this filling structure is such that no current can flow along the lateral wall of the hole. In this connection, by contrast with what is seen, for example, in what are known as "vias", the first and second electrodes 43, 44 are electrically isolated from each other, so that the piezoelectric material is subjected to an electrical field when in use.

Additionally, the holes may also extend through the first lower electrode 43, which may therefore be pierced.

Finally, as mentioned above, the present piezoelectric actuator may be formed in a MEMS device other than a microfluidic device, for example a micro-mirror or a micropump. In this connection, the piezoelectric region may be mechanically coupled to different components by a membrane, such as a cantilever element, a microbridge, a pierced membrane, or the like.

The invention claimed is:
1. A MEMS device comprising:
 a piezoelectric actuator including a film of piezoelectric material and first and second electrodes, the film of piezoelectric material being interposed between the first and second electrodes, the film of piezoelectric material and the second electrode including a plurality of through holes, the first electrode having a solid uninterrupted surface facing the plurality of through holes; and
 a membrane of semiconductor material, wherein the piezoelectric actuator is coupled to the membrane and configured to cause the membrane to deform.
2. The MEMS device according to claim 1, wherein the film of piezoelectric material is PZT.

3. The MEMS device according to claim 1, wherein the film of piezoelectric material has a thickness between 0.2 μm to 28 μm.

4. The MEMS device according to claim 1, wherein the plurality of through holes have lateral walls, wherein the lateral walls are covered by dielectric regions.

5. The MEMS device according to claim 1, wherein the film of piezoelectric material forms a single-layer piezoelectric structure.

6. The MEMS device according to claim 1, wherein a ratio between a volume occupied by the plurality of through holes and a volume of a reference region equal to the film of piezoelectric material that is free of the plurality of through holes is within a range of 1%-20%.

7. The MEMS device according to claim 1, wherein the plurality of through holes are arranged symmetrically with respect to a central axis of the film of piezoelectric material.

8. The MEMS device according to claim 7, wherein the plurality of through holes have a cylindrical shape and are arranged with axial symmetry.

9. The MEMS device according to claim 7, wherein the plurality of through holes are arranged with central symmetry.

10. The MEMS device according to claim 1, wherein the second electrode includes a plurality of through openings aligned with the plurality of through openings of the film of piezoelectric material, the MEMS device further comprising a dielectric material in the plurality of through openings of the film of piezoelectric material and the second electrode and on the first electrode, wherein the dielectric material electrically isolates the first and second electrodes from each other.

11. The MEMS device according to claim 1, further comprising:
a fluid containment chamber partially delimited by the membrane;
a fluid access channel in fluid connection with the fluid containment chamber; and
a drop emission channel in fluid connection with the fluid containment chamber.

12. A MEMS device comprising:
a piezoelectric actuator including:
first and second electrodes; and
a piezoelectric film between the first and second electrodes, the first electrode being a continuous solid surface, wherein the second electrode and the piezoelectric film including a plurality of through holes, the continuous solid surface of the first electrode facing the plurality of through holes of the second electrode and the piezoelectric film; and
a membrane of semiconductor material, wherein the piezoelectric actuator is coupled to the membrane and configured to cause the membrane to deform.

13. The MEMS device according to claim 12, further comprising a dielectric layer on a surface of the piezoelectric film and in the plurality of through holes of the piezoelectric film and the plurality of through holes of the second electrode.

14. The MEMS device according to claim 12, wherein the plurality of through holes of the piezoelectric film reduces a volume of the piezoelectric film of a same size and shape by between 10% to 20%.

15. The MEMS device according to claim 12, wherein the plurality of through holes of the piezoelectric film are arranged in groups, the groups having a repeatable pattern along a length of the piezoelectric film.

16. The MEMS device according to claim 12, wherein the MEMS device is a microfluidic device, a micromirror, or a micropump.

17. A microfluidic device comprising:
a chamber configured to hold a fluid;
an inlet in fluid communication with the chamber;
an outlet in fluid communication with the chamber;
a membrane delimiting a portion of the chamber; and
a piezoelectric actuator on the membrane, the piezoelectric actuator including a piezoelectric film and first and second electrodes on opposing sides of the piezoelectric film, the first electrode being a continuous solid surface that is directly coupled to the membrane, the piezoelectric film and the second electrode comprising a plurality of through holes facing the continuous solid surface of the first electrode, the piezoelectric actuator being configured to deform the membrane and cause fluid to be expelled from the chamber through the outlet.

18. The microfluidic device according to claim 17, wherein the plurality of through holes are arranged in groups that repeat along a length of the piezoelectric film.

19. The microfluidic device according to claim 17, wherein the plurality of through holes reduces a volume of the piezoelectric film of a same size and shape by between 1% to 20%.

* * * * *